(12) United States Patent
Wens et al.

(10) Patent No.: US 10,901,015 B2
(45) Date of Patent: Jan. 26, 2021

(54) METHOD AND SYSTEM FOR CALCULATING MODEL PARAMETERS FOR A COIL TO BE MODELLED

(71) Applicant: MINDCET BVBA, Leuven (BE)

(72) Inventors: Mike Irena Georges Wens, Burg-Reuland (BE); Jef Thone, Borgerhout (BE)

(73) Assignee: MINDCET BVBA

(*) Notice: Subject to any disclaimer, the term of this patent is extended or adjusted under 35 U.S.C. 154(b) by 905 days.

(21) Appl. No.: 14/372,815

(22) PCT Filed: Jan. 8, 2013

(86) PCT No.: PCT/BE2013/000001
§ 371 (c)(1),
(2) Date: Jul. 17, 2014

(87) PCT Pub. No.: WO2013/110145
PCT Pub. Date: Aug. 1, 2013

(65) Prior Publication Data
US 2014/0372059 A1    Dec. 18, 2014

(30) Foreign Application Priority Data

Jan. 27, 2012  (BE) .................................. 2012/0054

(51) Int. Cl.
*G01R 21/133* (2006.01)
*G01R 27/26* (2006.01)
(Continued)

(52) U.S. Cl.
CPC ........... *G01R 21/133* (2013.01); *G01R 19/00* (2013.01); *G01R 27/08* (2013.01);
(Continued)

(58) Field of Classification Search
CPC .. G01R 21/133; G01R 27/08; G01R 27/2611; G01R 27/2688; G01R 19/00; G01R 19/0007
See application file for complete search history.

(56) References Cited

U.S. PATENT DOCUMENTS 3,173,053 A * 3/1965 Mead ..................... G01S 7/12
                                                 315/378
4,032,836 A * 6/1977 Gross ..................... H03H 11/04
                                                 323/356
(Continued)

OTHER PUBLICATIONS eCircuit Center, SMPS Basics the Buck Converter, Dec. 18, 2005 [retrieved on Nov. 5, 2018]. Retrieved from the Internet<URL: https://web.archive.org/web/20051218232940/http://www.ecircuitcenter.com/Circuits/smps_buck/smps_buck.htm>. (Year: 2005).*

(Continued)

*Primary Examiner* — Catherine T. Rostovski
*Assistant Examiner* — Liam R Casey
(74) *Attorney, Agent, or Firm* — McDonnell Boehnen Hulbert & Berghoff LLP

(57) ABSTRACT

Method for calculating model parameters for a coil (L), comprising of: incorporating the coil into a converter (1) with a switching element (2); connecting a resistive load (9); applying an input voltage ($U_{in}$); controlling the switching element in order to obtain a periodically varying voltage across the coil; measuring at least a first and second quantity representative of respectively the voltage ($U_L$) across and the current ($i_L$) through the coil; determining at least one voltage value and at least one current value on the basis of the measured first and second quantity; calculating a loss resistance and/or a loss power of the coil on the basis of the at least one voltage value and the at least one current value.

19 Claims, 6 Drawing Sheets

(51) Int. Cl.
*G01R 19/00* (2006.01)
*G01R 27/08* (2006.01)
*G06F 30/367* (2020.01)

(52) U.S. Cl.
CPC ........ *G01R 27/2611* (2013.01); *G06F 30/367* (2020.01); *G01R 27/2688* (2013.01)

(56) References Cited

U.S. PATENT DOCUMENTS

| | | | |
|---|---|---|---|
| 6,321,169 B1 | 11/2001 | Iwao | |
| 6,876,936 B2 | 4/2005 | Ramesh et al. | |
| 7,222,034 B2 | 5/2007 | Ramesh et al. | |
| 7,365,526 B2 * | 4/2008 | Cha | H02M 3/1588 323/284 |
| 8,710,810 B1 * | 4/2014 | McJimsey | H02M 3/1584 323/272 |
| 2002/0185995 A1 * | 12/2002 | Mitamura | H02M 3/158 323/282 |
| 2005/0017707 A1 | 1/2005 | Ramesh et al. | |
| 2005/0184736 A1 * | 8/2005 | Ramesh | G01R 33/14 324/522 |
| 2008/0030178 A1 * | 2/2008 | Leonard | H02M 3/156 323/282 |
| 2008/0224625 A1 * | 9/2008 | Greenfeld | H05B 45/37 315/201 |
| 2010/0039735 A1 * | 2/2010 | Trescases | H02M 3/1588 361/18 |
| 2011/0311027 A1 * | 12/2011 | Rexhausen | H02M 3/156 378/111 |
| 2012/0062031 A1 * | 3/2012 | Buthker | H02M 3/158 307/31 |
| 2012/0069611 A1 * | 3/2012 | Yang | H02M 1/4225 363/44 |
| 2012/0139471 A1 * | 6/2012 | Dubovsky | H01M 10/465 320/101 |
| 2013/0076317 A1 * | 3/2013 | Yeh | H02M 1/4225 323/209 |

OTHER PUBLICATIONS

PCT International Search Report and Written Opinion, PCT International Application No. PCT/BE2013/000001, dated Apr. 29, 2013.
Wang, Laili et al., "Design of Ultrathin LTCC Coupled Inductors for Compact DC/DC Converters", IEEE Transactions on Power Electronics, vol. 26, No. 9, Sep. 2011, pp. 2528-2541.
Erickson, Robert W. et al., "A Multiple-Winding Magnetics Model Having Directly Measurable Parameters", 29th Annual IEEE Power Specialists Conference, vol. 2, May 17-22, 1998, pp. 1472-1478.
Hayes, John G. et al., "Comparison of Test Methods for Characterization of High-Leakage Two-Winding Transformers", IEEE Transactions on Industry Applications, vol. 45, No. 5, Sep./Oct. 2009, pp. 1729-1741.
Chung, H.Y. et al., "Analysis of Buck-Boost Converter Inductor Loss Using a Simple Online B-H Curve Tracer", Fifteenth Annual IEEE Applied Power Electronics Conference and Exposition, vol. 2, Feb. 6, 2000, pp. 640-646.
Belgium Search Report, Belgium Application No. 2012/00054 dated Jan. 27, 2012, 7 pages and machine translation of Belgium Search Report, 8 pages.

* cited by examiner

METHOD AND SYSTEM FOR CALCULATING MODEL PARAMETERS FOR A COIL TO BE MODELLED

CROSS REFERENCE TO RELATED APPLICATIONS

The present application is a national stage entry of PCT/BE2013/000001, filed Jan. 8, 2013, and claims priority to BE 2012/0054, filed Jan. 27, 2012. The full disclosures of BE 2012/0054 and PCT/BE2013/000001 are incorporated herein by reference.

The present invention relates to a method and a system for calculating-model parameters for at least one coil to be modelled. This at least one coil to be modelled can form part of a transformer.

The properties of a coil depend on the voltage applied across the coil and/or the current applied through the coil, and depend particularly on the amplitude, frequency and waveform of these signals. A known technique for measuring a coil uses a so-called LCR meter. A sine wave is used as signal source in an LCR meter. In accordance with other techniques the B-H curve is plotted and measured.

When a coil is used in a circuit, the signals are often not sine waves but rather block waves or sawteeth, and high currents and/or voltages can occur. In such conditions it is found in practice that an LCR meter does not produce good values for accurate modelling of the coil. The measurement of a B-H curve produces better models, but has the drawback that it is complex and does not take into account the frequency dependence of these parameters.

The present invention has for its object to provide a system and method of the type stated in the preamble with which a coil can be modelled in a wide range in a manner which is accurate and can be readily implemented in practice, i.e. a system and method with which model parameters, such as the inductance and the losses and non-linearities of a coil can be modelled for a wide range of applications.

The method according to the invention is distinguished for this purpose in that it comprises the following steps. The at least one coil to be modelled is incorporated into a DC to DC converter with at least one switching element. A resistive load is connected between the output terminals of the DC to DC converter. An input voltage is applied at the input terminals of the DC to DC converter. The first switching element is controlled in accordance with a set frequency and duty cycle to obtain a voltage varying periodically in time across a coil of the at least one coil to be modelled, this such that the voltage across the coil depends on the input voltage for at least a part of a period of the periodic voltage. At least a first quantity representative of the voltage across the coil and at least a second quantity representative of the current through the coil are then measured at successive points in time in at least said part of a period. At least one voltage value for the voltage across the coil is determined on the basis of the measured first quantity. At least one current value for the current through the coil is determined on the basis of the measured second quantity. A loss resistance and/or a loss power of the coil is subsequently calculated on the basis of the at least one voltage value and the at least one current value. In accordance with the applications for which the coil is intended, the above stated steps can be repeated for a different input voltage and/or for a different frequency and/or for a different duty cycle and/or for a different resistive load.

Incorporating the coil into a DC to DC converter creates a realistic operational environment of the coil. Such an operational environment further allows a number of input parameters such as the input voltage, the frequency, the duty cycle and the resistance value of the load to be varied in accordance with the operating range over which it is desired to characterize the coil. An accurate result can further be obtained by making use of successive measurements.

According to an advantageous embodiment, the method further comprises of determining on the basis of the measured second quantity at least one first and second current value for the current through the coil at respectively a first and second point in time of the successive points in time. The inductance of the coil is then calculated on the basis of the voltage value, the loss resistance and/or the loss power and at least the first and second current values.

The loss power can for instance be calculated as an average of the product of the voltage across the coil and the current through the coil, based on the measurements of the first and second quantities at the successive points in time. For the purpose of this calculation the successive points in time preferably cover a substantially complete period. According to a possible embodiment, the loss power is calculated as follows:

$$P_{loss} = \frac{1}{T} \cdot \int_0^T i_L(t) \cdot u_L(t) \, dt$$

wherein T is the duration of a period, $i_L(t)$ is the current through the coil at point in time t, and $u_L(t)$ is the voltage across the coil at point in time t.

According to another possibility, an approximate formula is used to calculate the loss power:

$$P_{loss} = \frac{I_{max} + I_{min}}{2} \cdot \frac{1}{T}[U_{Lg1} \cdot t_{on} + U_{Lg2} \cdot t_{off}]$$

wherein $I_{min}$ corresponds to a first current value measured at a first point in time t=0 and $I_{max}$ corresponds to a second current value measured at a second point in time t=$t_{on}$, T is the duration of a period, $U_{Lg1}$ is a value of the voltage across the coil between the first point in time t=0 and the second point in time t=$t_{on}$, and $U_{Lg2}$ is a value of the voltage across the coil between the second point in time t=$t_{on}$ and the end of a period t=T, and $t_{off}$=T-$t_{on}$. Note that $U_{Lg1/2}$ can be an average voltage of a number of successive measurements, but can also be based on one measurement if $U_{Lg1/2}$ is substantially constant, as will typically be the case.

According to an advantageous embodiment, the loss resistance is calculated as the quotient of the loss power and the square of an effective current through the coil, wherein the effective current is calculated on the basis of the measurements of the second quantity. The loss resistance is for instance calculated as:

$$R_{LS} = \frac{P_{loss}}{I_{L_{eff}}^2}$$

wherein $I_{L_{eff}}$ is the effective current.

The effective current can for instance be calculated as the RMS value for the current through the coil over the full period T:

$$I_{L_{eff}} = \sqrt{\frac{1}{T}\int_0^T (i_L(t))^2\, dt}$$

wherein T is the duration of a period and $i_L(t)$ is the current through the coil at point in time t. According to another possibility, an approximate formula is used to calculate $I_{L_{eff}}$:

$$I_{L_{eff}} = \left( \frac{I_{max} + I_{min}}{2} \cdot \sqrt{1 + \frac{1}{12}\cdot \left(\frac{I_{max}-I_{min}}{\frac{I_{max}+I_{min}}{2}}\right)^2}\,\right)$$

According to an advantageous embodiment, the inductance is calculated on the basis of the following formula:

$$L = \frac{R_{LS}\cdot t_{on}}{\ln\left[\frac{I_{min}\cdot R_{LS} - U_{Lg1}}{I_{max}\cdot R_{LS} - U_{Lg1}}\right]}$$

wherein $I_{min}$ corresponds to the first current value measured at the first point in time t=0 and $I_{max}$ corresponds to the second current value measured at the second point in time t=$t_{on}$; $U_{Lg1}$ corresponds to the voltage value; and $R_{LS}$ is the loss resistance of the coil. Note that $U_{Lg1}$ can be an average voltage of a number of successive measurements, but can also be based on one measurement if $U_{Lg1}$ is substantially constant, as will typically be the case.

The model of FIG. 11A can be used in order to simulate a circuit in which the coil is incorporated, i.e. a series connection of an inductance L and the loss resistance $R_{LS}$.

The voltage value is preferably calculated as an average making use of the measurements of the first quantity. According to an advantageous embodiment, said first part of the period is the part in which the coil is charged, and this first part has a duration $t_{on}$. The voltage value can then be calculated as $$U_{Lg1} = \frac{1}{t_{on}} \int_0^{t_{on}} u_L(t)\, dt$$

wherein $u_L(t)$ is the voltage across the coil at point in time t and $u_L(t)$ is determined on the basis of the measurements of the first quantity.

According to an advantageous embodiment, the DC to DC converter further comprises a second switching element, typically a diode, in particular a Schottky or fast reverse recovery diode, or an active switching element such as a transistor. The DC to DC converter is preferably one of the following: a buck converter, boost converter, buck-boost converter, non-inverting buck-boost converter, serial or parallel resonant converter, fly-back converter, full or half bridge buck converter. Note that this list is not exhaustive and that variants hereof also fall within the scope of the invention. Any DC to DC converter in which a coil can be incorporated such that the voltage across the coil changes in controllable manner will in principle be suitable for the present invention. The skilled person will further appreciate that the present invention can also be applied for the purpose of modelling one or more coils of a transformer, and/or for modelling the behaviour of a transformer or of coupled coils.

According to a further developed embodiment, there is an output voltage across the resistive load, and the coil is incorporated such that for a part of the period the voltage across the coil is substantially equal to the difference between the input voltage and the output voltage. The input voltage will in this way influence the voltage across the coil during this part of the period, and the input voltage thus forms one of the parameters which can be varied in order to characterize the coil.

In addition, the first switching element is preferably incorporated such that the voltage across the coil varies with the same frequency and duty cycle as the signal with which the first switching element is controlled. The first switching element can for instance be connected between an input terminal of the DC to DC converter and the coil. In addition, an input capacitor is preferably connected between the input terminals of the DC to DC converter and an output capacitor between the output terminals of the DC to DC converter.

The present invention also relates to a storage medium for storing computer instructions for performing one or more steps of an embodiment of the method of the invention. The computer instructions can for instance thus comprise instructions for determining a voltage value for the voltage across the coil on the basis of the measured first quantity, determining at least one current value for the current through the coil on the basis of the measured second quantity and calculating a loss power and/or loss resistance and/or inductance of the coil on the basis of the at least one voltage value and the at least one current value. These instructions preferably calculate a loss resistance and/or loss power and/or induction in one of the above described ways.

Finally, the invention relates to a system of the type stated in the preamble which is distinguished as follows. The system comprises a DC to DC converter with at least a first switching element and the coil to be modelled incorporated therein. A resistive load is connected between the output terminals of the converter. Further provided are: a voltage source for providing an input voltage at the input terminals of the converter, control means for controlling the first switching element according to a frequency and duty cycle in order to obtain a voltage across the coil varying periodically in time, first measuring means for measuring a first quantity representative of the voltage across the coil, second measuring means for measuring a second quantity representative of the current through the coil, and computer means for determining at least one voltage value for the voltage across the coil on the basis of the measured first quantity; for determining at least one current value for the current through the coil on the basis of the measured second quantity; and for calculating a loss resistance and/or loss power and/or inductance of the coil on the basis of the at least one voltage value and the at least one current value.

According to advantageous embodiments, the system is further adapted to perform one or more of the calculation steps described in the method claims and/or the DC to DC converter is provided with one or more of the measures described in the method claims.

The invention will be further elucidated on the basis of a number of non-limitative exemplary embodiments of the method and the system according to the invention with reference to the accompanying drawings, in which.

Figure 1:
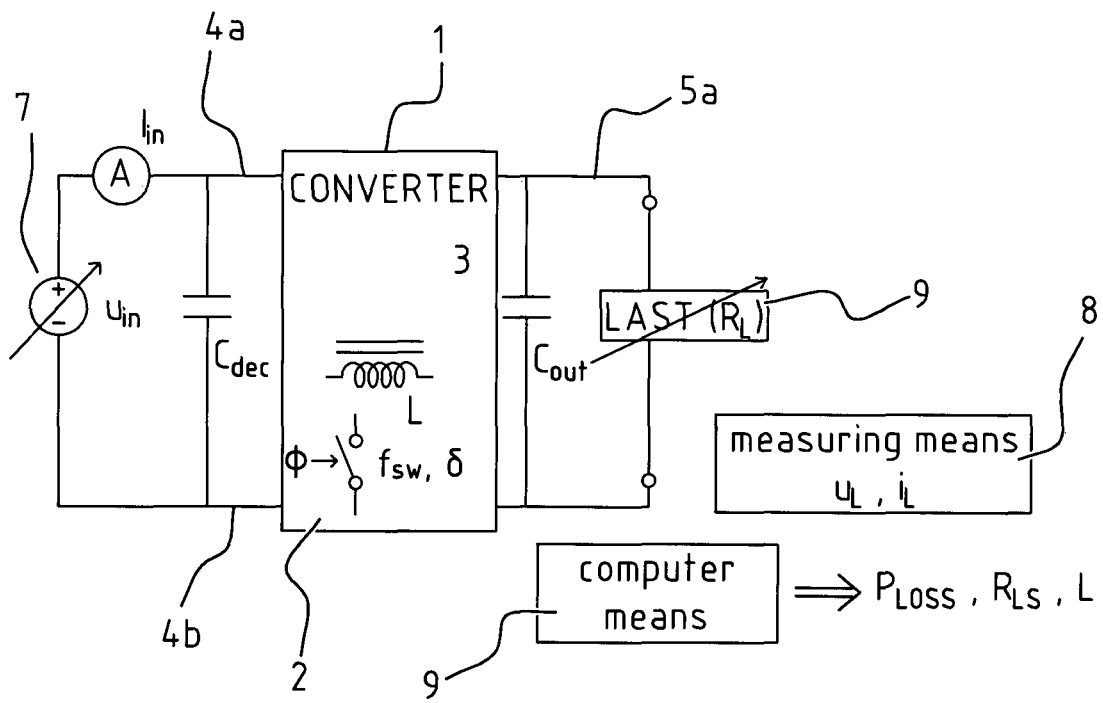
FIG. 1 is a schematic view of an embodiment of a system according to the invention.

A first embodiment of a system and method according to the invention will now be illustrated with reference to FIGS. 1 and 2. The system comprises a DC to DC converter 1 with a first switching element 2. The coil 3 to be modelled is incorporated into the DC to DC converter 1. Converter 1 has input terminals 4a, 4b and output terminals 5a, 5b. Connected between output terminals 5a, 5b is a resistive load 6 with an adjustable resistor $R_L$. Further provided is an adjustable voltage source 7 for the purpose of providing an input voltage $U_{in}$ at input terminals 4a, 4b of the converter. Control means (not shown) are further provided for the purpose of providing a signal Φ for controlling the first switching element 2 at a frequency $f_{SW}$, and a duty cycle δ. Measuring means 8 are further provided for measuring the voltage across the coil and the current through the coil. These measuring means are preferably adapted to measure the voltage across the coil $u_L$ and the current through the coil $i_L$ at successive points in time which cover a number of periods $T=1/f_{SW}$. Note that it is possible that measuring means 8 do not measure $u_L$ and $i_L$ directly, but measure other quantities representative of respectively $u_L$ and $i_L$. Further provided is a computer means 9 for calculating the loss power $P_{loss}$, the loss resistance $R_{LS}$ and the inductance L of the coil.

Figure 2:
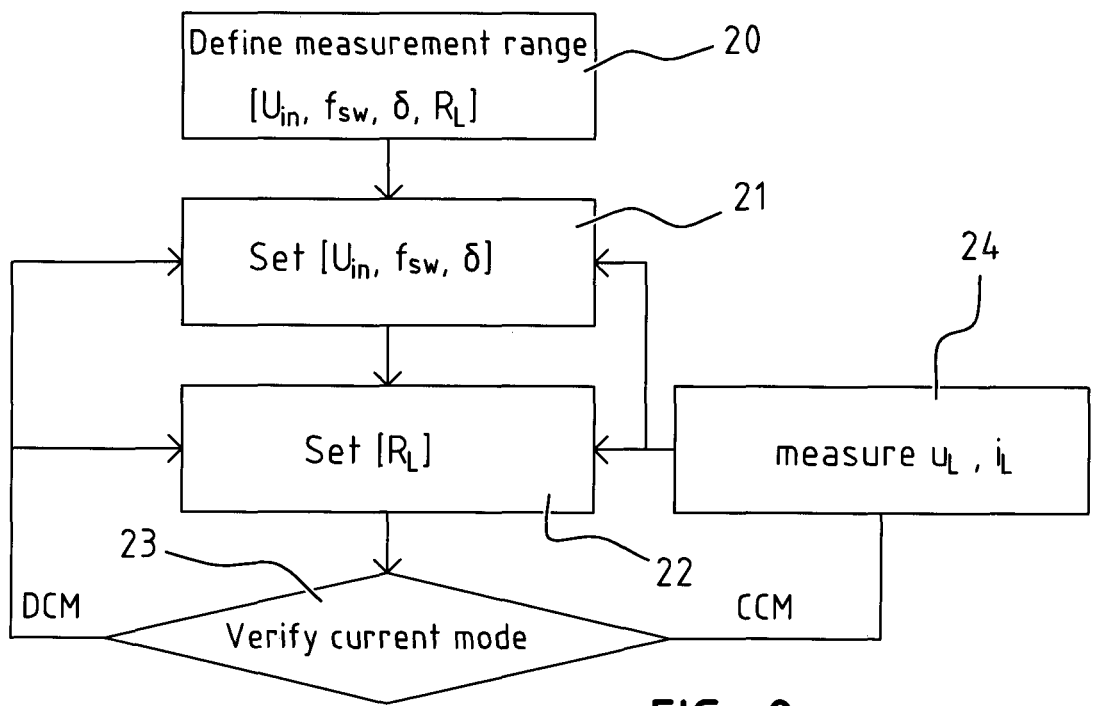
FIG. 2 is a flow diagram illustrating the measuring steps of an embodiment of the method according to the invention.

Following assembly of the measurement setup of FIG. 1, the limits must be determined for the input parameters $U_{in}$, $f_{SW}$, δ and $R_L$ in order to define the measurement range, see step 20 of FIG. 2. In a subsequent step 21 a value is set for $U_{in}$, $f_{SW}$ and δ on the basis of the defined measurement range, and the resistance $R_L$ of the load is set in a second step 22. Verification then takes place of whether the converter circuit is operating in a Discontinuous Current Mode (DCM) or in a Continuous Current Mode (CCM). In the embodiment illustrated in FIG. 2 measurements are performed only in the CCM mode. If it is determined that the circuit is in a DCM mode, the input parameters are modified in steps 21 and/or 22. Note however that it is also possible to apply the method according to the invention when the converter is in a DCM mode.

Following the measurement of $u_L$ and $i_L$ in step 24, the input parameters are modified in steps 21 and/or 22. The skilled person will appreciate that it is possible to proceed in many different ways here, and can for instance first vary the input voltage $U_{in}$, while the other input parameters $f_{SW}$, δ and $R_L$ are kept constant, after which $f_{SW}$ and/or δ can be varied and finally $R_L$. Other sequences can of course also be envisaged.

Figure 3:
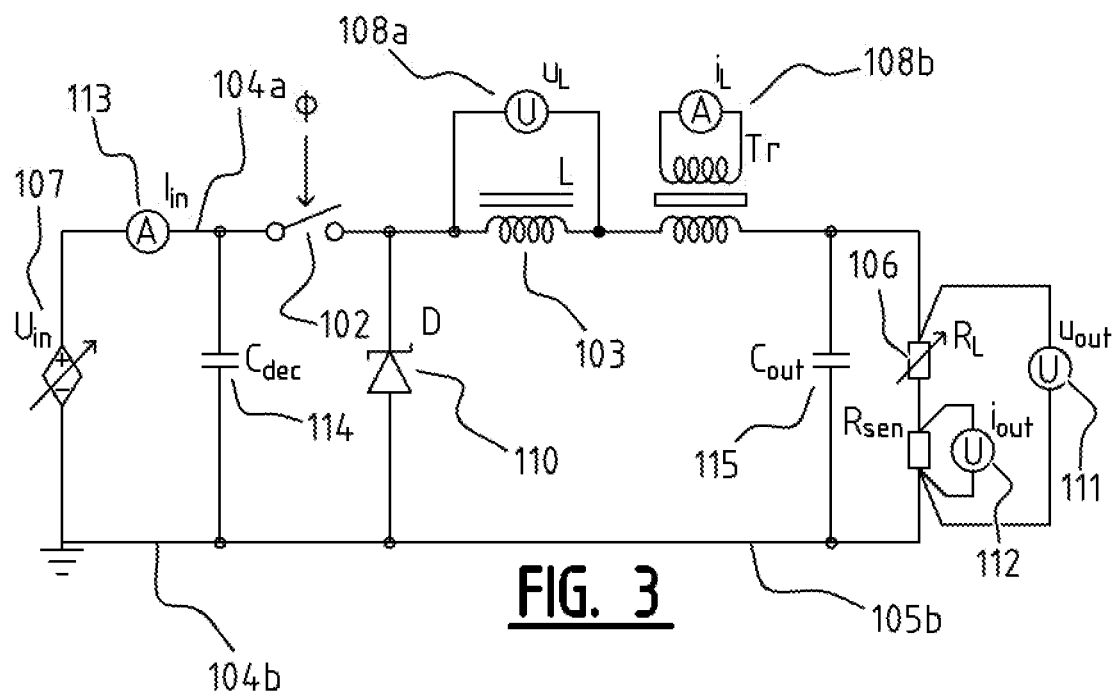
FIG. 3 shows a first embodiment of a measurement setup according to the invention.

According to a first variant as illustrated in FIG. 3, the DC to DC converter is a buck converter. The first switching element 102 is connected between an input terminal 104a and a first terminal of coil 103. Coil 103 is connected in series to the first switching element 102. The other terminal of coil 103 is connected via current measuring means 108b to an output terminal 105a. A second switching element in the form of a Schottky diode 110 is further connected between the one terminal of coil 103 and input terminal 104b. Voltage measuring means 108a are also provided for measuring the voltage $u_L$ across the coil. An input capacitor $C_{dec}$ is connected between the input terminals 104a, 104b. An output capacitor $C_{out}$ is connected between output terminals 105a, 105b. In addition to the measuring means for $i_L$ and $u_L$, additional measuring means 111, 112, 113 can be provided for the purpose of measuring respectively the output voltage $u_{out}$, the output current $i_{out}$, the input current $I_{in}$ and the input voltage $U_{in}$ in order to verify the other measurements.

Figure 4:
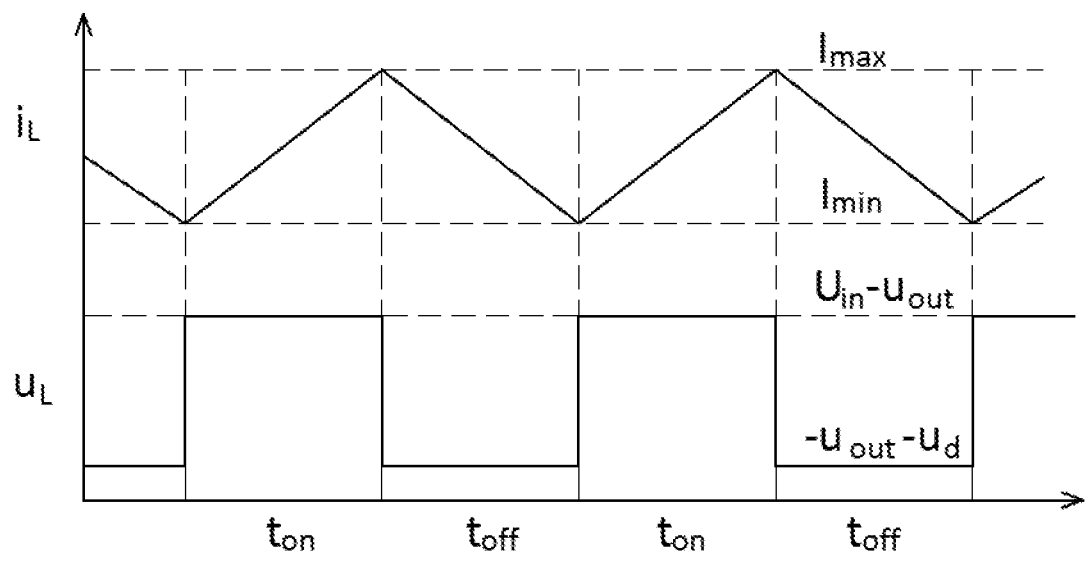
FIG. 4 is a graph illustrating schematically the voltage measured across the coil and the current measured through the coil in the embodiment of FIG. 3.

FIG. 4 illustrates schematically typical measurement results for $i_L$ and $u_L$ as a function of time. This schematic graph shows a linear current progression, while the skilled person will appreciate that this progression is typically exponential. The voltage progression is further shown schematically as a block wave, and the skilled person will appreciate that the voltage across the coil is not wholly constant during charging ($t_{on}$) and discharging ($t_{off}$) of the coil. The current $i_L$ through the coil varies between a minimum value $I_{min}$ and a maximum value $I_{max}$. During charging the voltage across the coil $u_L$ is equal to $U_{in}-U_{out}$, and during discharge $u_L$ is equal to $u_{out}-u_d$, wherein $u_d$ is the voltage across the diode.

For the embodiment of FIG. 3 the loss power can be calculated on the basis of the following formula:

$$P_{loss} = \frac{1}{T} \cdot \int_0^T i_L(t) \cdot u_L(t)\, dt$$

wherein T is the period, $i_L(t)$ is the current through the coil at point in time t and $u_L(t)$ is the voltage across the coil at point in time t.

According to another possibility, the loss power can be calculated with the following approximate formula:

$$P_{loss} = \frac{I_{max}+I_{min}}{2} \cdot \frac{1}{T}[U_{Lg1}\cdot t_{on} + U_{Lg2}\cdot t_{off}]$$

wherein $U_{Lg1}$ is the average of the voltage across the coil between the first point in time t=0 and the second point in time t=$t_{on}$, $U_{Lg2}$ is the average of the voltage across the coil between the second point in time t=$t_{on}$ and the end of a period t=T, and $t_{off}=T-t_{on}$.

The loss resistance can then be calculated as:

$$R_{LS} = \frac{P_{loss}}{I_{L_{eff}}^2}$$

wherein $I_{L_{eff}}$ is the effective current. $I_{L_{eff}}$ can be calculated in this formula as the RMS value of the current through the coil on the basis of the following formula:

$$I_{L_{eff}} = \sqrt{\frac{1}{T}\int_0^T (i_L(t))^2\, dt}$$

or the effective current can be calculated on the basis of the approximate formula:

$$I_{L_{eff}} = \left( \frac{I_{max} + I_{min}}{2} \cdot \sqrt{1 + \frac{1}{12} \cdot \left( \frac{I_{max} - I_{min}}{\frac{I_{max} + I_{min}}{2}} \right)^2} \right)$$

The inductance can then be calculated on the basis of the following formula:

$$L = \frac{R_{LS} \cdot t_{on}}{\ln\left[ \frac{I_{min} \cdot R_{LS} - U_{Lg1}}{I_{max} \cdot R_{LS} - U_{Lg1}} \right]}$$

Note that for the variant of FIG. 3B the following formulae further apply:

$$0 < t < t_{on} : u_L(t) = U_{in} - u_{out}(t)$$

$$t_{on} < t < T : u_L(t) = u_{out}(t) - u_d(t)$$

wherein $u_d(t)$ is the voltage across the Schottky diode 110. The output voltage $u_{out}(t)$ could therefore also be measured as approximation for the voltage across the coil. It is generally recommended in practice to measure both $u_L(t)$ and $u_{out}(t)$.

In the variant illustrated in FIG. 3 the measuring means 108 for measuring the current through the coil are connected in series to the coil. According to another variant, a small resistor could be connected in series to the output capacitor $C_{out}$ and the current through this resistor could be measured. If the current through the resistor is $i_R$, then $i_L = i_R + i_{out}$. $i_R$ and $i_{out}$ could therefore also be measured instead of measuring $i_L$.

Figure 5:
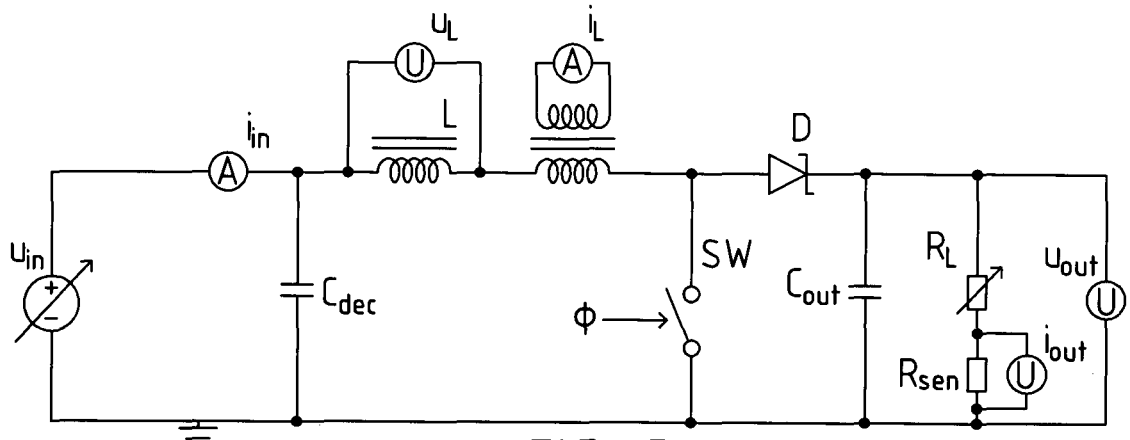
FIG. 5 illustrates a second embodiment of a measurement setup according to the invention.
Figure 6:
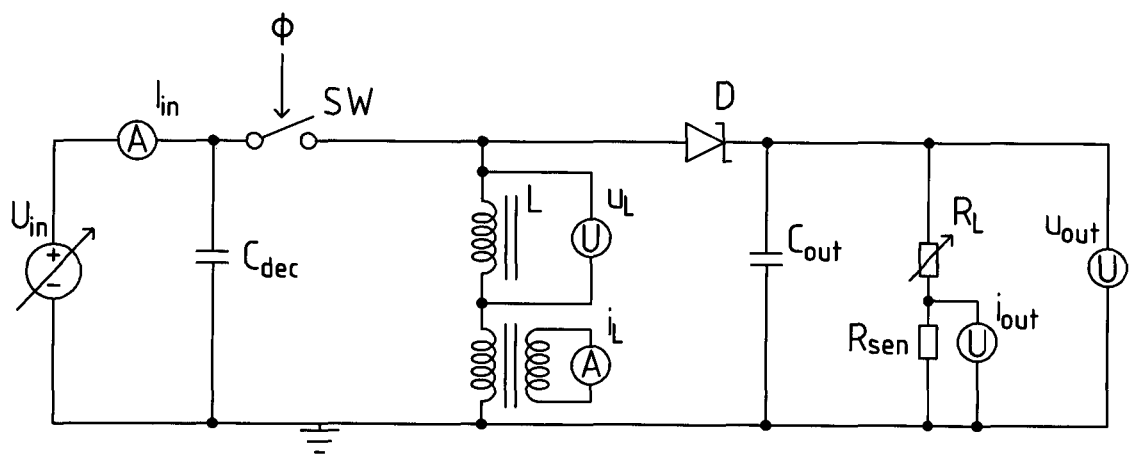
FIG. 6 illustrates a third embodiment of a measurement setup according to the invention.
Figure 7:
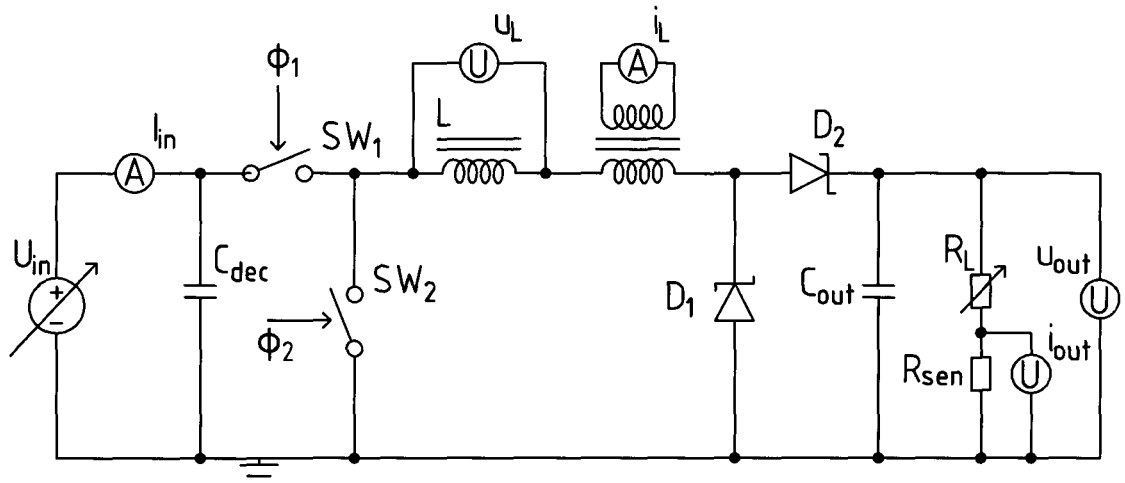
FIG. 7 illustrates a fourth embodiment of a measurement setup according to the invention.
Figure 8:
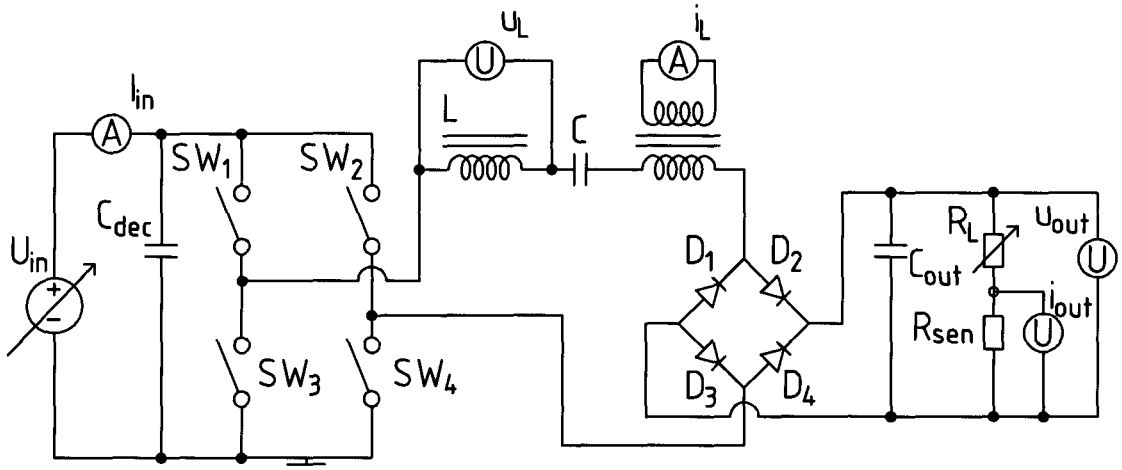
FIG. 8 illustrates a fifth embodiment of a measurement setup according to the invention.

FIGS. 5-10 show a number of other possible measurement setups which can be used in an embodiment of the method according to the invention. FIG. 5 illustrates a boost converter, FIG. 6 a buck-boost converter, FIG. 7 a non-inverting buck-boost converter and FIG. 8 a series resonant converter. Since the measurement and calculation principles are similar to those described with reference to FIG. 2, they will not be further elucidated.

Figure 9:
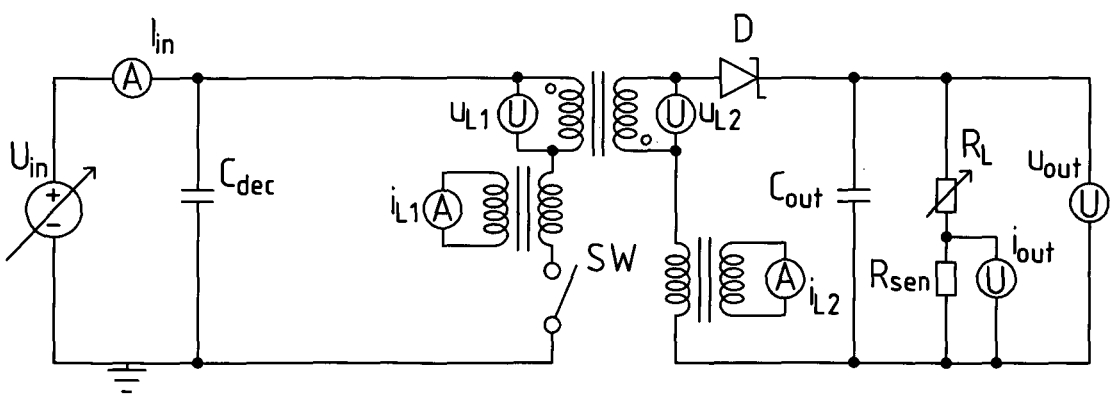
FIG. 9 illustrates a sixth embodiment of a measurement setup according to the invention.
Figure 10:
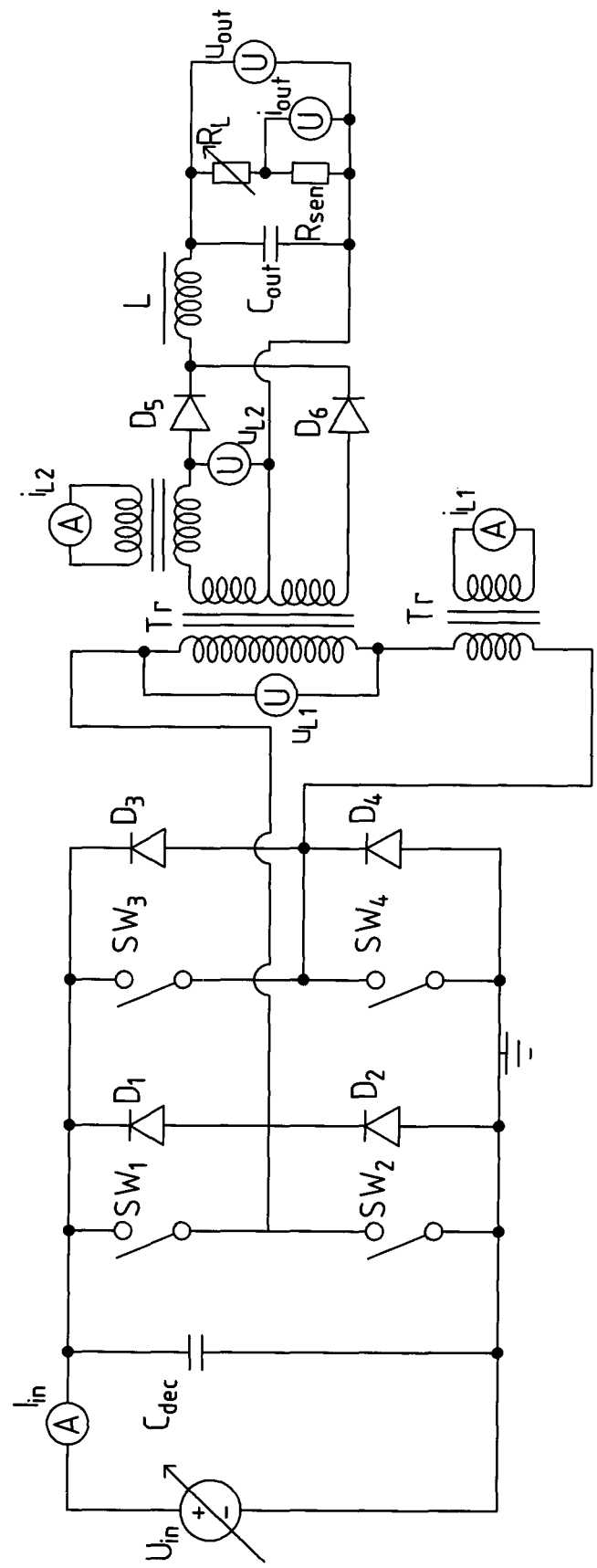
FIG. 10 illustrates a seventh embodiment of a measurement setup according to the invention.
Figure 11A:
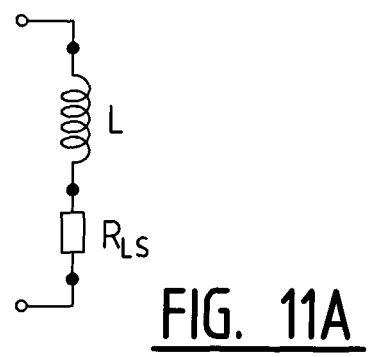
FIGS. 11A and 11B illustrate a model for respectively a coil and a transformer.
Figure 11B:
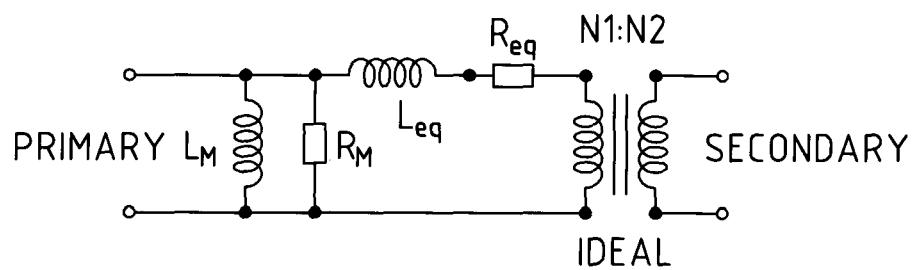

Finally, FIGS. 9 and 10 illustrate two further alternative measurement setups which can for instance be used to characterize transformers. FIG. 9 illustrates a fly-back converter and FIG. 10 a full bridge buck converter. In both circuits the voltage $U_{L1}$ across the primary winding as well as the voltage $U_{L2}$ across the secondary winding are measured. In addition, the current $I_{L1}$ through the primary winding and the current $I_{L2}$ through the secondary winding are measured. Note that in the circuit of FIG. 10 two identical windings are connected in series. Since these windings are identical, it suffices to measure the current through one of these windings and the voltage across one of these windings. FIG. 11B illustrates a possible model for a transformer in which all losses of the transformer are modelled on the primary side. Note that it is also possible to provide a model in which the losses are modelled on the secondary side. In the illustrated model N1 is the number of windings on the primary side and N2 the number of windings on the secondary side. The model further comprises a magnetization inductance $L_M$ as a result of the finite permeability of the core material of the transformer, a loss resistance $R_M$ as a result of the core, i.e. as a result of the so-called iron losses, an equivalent leakage inductance $L_{eq}$ as a result of the finite coupling between the primary and the secondary winding, and an equivalent loss resistance $R_{eq}$ as a result of the serial resistance of the primary and secondary windings. The skilled person will appreciate that the parameters of the model $L_M$, $R_M$, $L_{eq}$ and $R_{eq}$ can be calculated as a function of the measured voltages and currents $U_{L1}$, $I_{L1}$, $U_{L2}$ and $I_{L2}$ on the basis of formulae similar to those as presented above for modelling a single coil. It will once again be possible to use a more precise or an approximate formula.

As example of the method according to the invention a commercial coil was modelled using the method according to the invention. The manufacturer states as model parameters L=150 µH, $R_{LS}$=68 mΩ at f=0 Hz (DC), $I_{max}$=4 A. This coil was then measured using an embodiment of the method according to the invention. The results were as follows: L=144 µH, $R_{LS}$=320 mΩ, $L_{Leff}$=830 mA; at f=10 kHz and δ=$t_{on}$/T=0.5. This demonstrates that the existing models will not produce good results in circuit simulations compared to coils modelled according to an embodiment of the method according to the invention. After all, the coils are never used at 0 Hz (DC) but typically at significantly higher frequencies.

The invention is not limited to the above described exemplary embodiments and the skilled person will appreciate that many changes and modifications can be envisaged within the scope of the invention, which is defined solely by the following claims.

The invention claimed is:
1. A method for measuring at least one coil and calculating model parameters for the at least one coil to be modelled, the method comprising the following steps of:
  incorporating the at least one coil to be modelled into a DC to DC converter with at least a first switching element, which converter has input terminals and output terminals;
  connecting an adjustable resistive load between the output terminals of the DC to DC converter;
  applying an input voltage at the input terminals of the converter;
  controlling the first switching element in accordance with a frequency and duty cycle to obtain a voltage varying periodically in time across a coil of the at least one coil to be modelled, which voltage depends for at least a part of a period on the input voltage;
  wherein there is an output voltage across the adjustable resistive load, and the coil is incorporated such that for a part of the period the voltage across the coil is substantially equal to the difference between the input voltage and the output voltage;
  adjusting the adjustable resistive load to operate the DC to DC converter in a continuous current mode;
  measuring at least a first quantity representative of the voltage across the coil at successive points in time in at least said part of a period;
  measuring at least a second quantity representative of the current through the coil at successive points in time in at least said part of a period;
  determining at least one voltage value for the voltage across the coil on the basis of the measured first quantity;
  determining at least one current value for the current through the coil on the basis of the measured second quantity;

calculating at least one of a loss resistance or a loss power of the coil on the basis of the at least one voltage value and the at least one current value;

determining on the basis of the measured second quantity at least one first and second current value for the current through the coil at respectively a first and second point in time of the successive points in time in said part of the period; and calculating an inductance of the coil on the basis of said at least one voltage value, said at least one of the loss resistance or the loss power, and said at least one first and second current value; and repeating the above stated steps for a different frequency so as to determine a frequency dependent inductance of the coil.

2. The method of claim 1, wherein the loss power is calculated as an average of the product of the voltage across the coil and the current through the coil, based on the measurements of the first and second quantities at the successive points in time.

3. The method of claim 1, wherein the loss resistance is calculated as the quotient of the loss power and the square of an effective current through the coil, which effective current is calculated on the basis of the measurements of the second quantity.

4. The method of claim 3, wherein the loss resistance is calculated as the quotient of the loss power and the square of an effective current through the coil, which effective current is calculated on the basis of the at least one first and second current value.

5. The method of claim 1, wherein the inductance is calculated as $$L = \frac{R_{LS} \cdot t_{on}}{\ln\left[\frac{I_{min} \cdot R_{LS} - U_{Lg1}}{I_{max} \cdot R_{LS} - U_{Lg1}}\right]}$$

wherein $I_{min}$ corresponds to the first current value measured at the first point in time t=0 and $I_{max}$ corresponds to the second current value measured at the second point in time t=$t_{on}$; $U_{Lg1}$ corresponds to the average of the at least one voltage value; and $R_{LS}$ is the loss resistance.

6. The method of claim 1, wherein the voltage value is calculated as an average making use of the measurements of the first quantity.

7. The method of claim 1, wherein said part of the period is a part in which the coil is charged, wherein said part has a duration $t_{on}$.

8. The method of claim 7, wherein the voltage value is calculated as $$U_{Lg1} = \frac{1}{t_{on}} \int_0^{t_{on}} u_L(t) dt$$

wherein $u_L(t)$ is the voltage across the coil at point in time t and $u_L(t)$ is determined on the basis of the measurements of the first quantity.

9. The method of claim 1, wherein the DC to DC converter further comprises a second switching element, for instance a diode.

10. The method of claim 9, wherein the second switching element comprises a transistor.

11. The method of claim 9, wherein the second switching element is connected to a first terminal of the at least one coil and between the input terminals of the converter when the first switching element is closed.

12. The method of claim 1, wherein the DC to DC converter is one of the following: a buck converter, boost converter, buck-boost converter, non-inverting buck-boost converter, series or parallel resonant converter, fly-back converter, full or half bridge buck converter.

13. The method of claim 1, wherein the first switching element is connected between an input terminal of the DC to DC converter and the coil.

14. The method of claim 1, wherein an input capacitor is connected between the input terminals of the DC to DC converter and an output capacitor is connected between the output terminals of the DC to DC converter.

15. The method of claim 1, wherein the at least one coil forms part of a transformer with a first coil and a second coil,
wherein the measurement of the at least one first quantity comprises of:
measuring at least one first quantity representative of the voltage across the first coil; and
measuring at least one first quantity representative of the voltage across the second coil;
wherein the measurement of at least one second quantity comprises of:
measuring at least one second quantity representative of the current through the first coil; and
measuring at least one second quantity representative of the current through the second coil;
wherein determining of the at least one voltage value comprises of:
determining at least one voltage value for the voltage across the first coil on the basis of the measured first quantity; and
determining at least one voltage value for the voltage across the second coil on the basis of the measured first quantity;
wherein determining of the at least one current value comprises of:
determining at least one current value for the current through the first coil on the basis of the measured second quantity; and
determining at least one current value for the current through the second coil on the basis of the measured second quantity;
wherein calculation of a loss resistance and/or a loss power comprises of:
calculating a magnetization inductance and a magnetization loss resistance on the basis of the at least one voltage value for the first and second coil and the at least one current value for the first and second coil;
calculating an equivalent leakage inductance and an equivalent loss resistance on the basis of the at least one voltage value for the first and second coil and the at least one current value for the first and second coil.

16. A system for measuring at least one coil and calculating model parameters for the at least one coil to be modelled, the system comprising:
a DC to DC converter with at least a first switching element and the at least one coil to be modelled incorporated therein; which converter has input terminals and output terminals;
an adjustable resistive load with a resistor between the output terminals of the converter;
a voltage source connected for the purpose of providing an input voltage at the input terminals of the converter;

a controller configured to control the first switching element according to a plurality of set frequencies and duty cycles in order to obtain a voltage varying periodically in time across the coil of the at least one coil to be modelled, such that voltage depends for at least a part of a period on the input voltage;

wherein there is an output voltage across the adjustable resistive load, and the coil is incorporated such that for a part of the period the voltage across the coil is substantially equal to the difference between the input voltage and the output voltage;

a voltage measuring apparatus configured to measure at least a first quantity representative of the voltage across the coil at successive points in time in at least said part of a period;

a current measuring apparatus configured to measure at least a second quantity representative of the current through the coil at successive points in time in at least said part of a period;

a computer configured to
  i. adjust the adjustable resistive load to operate the DC to DC converter in a continuous current mode;
  ii. determine
    a. at least one voltage value for the voltage across the coil on the basis of the measured first quantity,
    b. at least one current value for the current through the coil on the basis of the measured second quantity;
  iii. determine, on the basis of the measured second quantity, at least a first and second current value for the current through the coil at respectively a first and a second point in time of the successive points in time in said part of the period;
  iv. calculate at least one of a loss resistance or a loss power of the coil on the basis of said at least one voltage value and said at least one current value;
  v. calculate a frequency-dependent inductance of the coil on the basis of said at least one voltage value, said at least one of the loss resistance or the loss power, and said at least one first and second current value;

wherein the computer is further configured to repeat the steps i-v for a different frequency.

17. The system of claim 16, wherein the computer means is configured to determine loss power as an average of the product of the voltage across the coil and the current through the coil, based on the measurements of the first and second quantities at the successive points in time.

18. The system of claim 16, further comprising a second switching element, wherein the second switching element comprises a transistor, and wherein the second switching element is connected to a first terminal of the at least one coil and between the input terminals of the converter when the first switching element is closed.

19. A method for measuring at least one coil and calculating model parameters for the at least one coil to be modelled, the method comprising the following steps of:

incorporating the at least one coil to be modelled into a DC to DC converter with at least a first switching element, which converter has input terminals and output terminals;

connecting an adjustable resistive load between the output terminals of the DC to DC converter;

applying an input voltage at the input terminals of the converter;

controlling the first switching element in accordance with a frequency and duty cycle to obtain a voltage varying periodically in time across a coil of the at least one coil to be modelled, which voltage depends for at least a part of a period on the input voltage;

wherein there is an output voltage across the adjustable resistive load, and the coil is incorporated such that for a part of the period the voltage across the coil is substantially equal to the difference between the input voltage and the output voltage;

verifying whether the DC to DC converter operates in a discontinuous current mode or in a continuous current mode;

if it is determined that the DC to DC converter operates in a discontinuous current mode modifying the resistive load and repeating the step of verifying; and if it is determined that the DC to DC converter operates in a continuous current mode performing the steps of:

measuring at least a first quantity representative of the voltage across the coil at successive points in time in at least said part of a period;

measuring at least a second quantity representative of the current through the coil at successive points in time in at least said part of a period;

determining at least one voltage value for the voltage across the coil on the basis of the measured first quantity;

determining at least one current value for the current through the coil on the basis of the measured second quantity;

calculating at least one of a loss resistance or a loss power of the coil on the basis of the at least one voltage value and the at least one current value;

determining on the basis of the measured second quantity at least one first and second current value for the current through the coil at respectively a first and second point in time of the successive points in time in said part of the period;

calculating an inductance of the coil on the basis of said at least one voltage value, said at least one of the loss resistance or the loss power, and said at least one first and second current value; and repeating the above stated steps for at least one of a different input voltage, a different frequency, or a different duty cycle.

* * * * *